(12) United States Patent
Cho et al.

(10) Patent No.: US 8,901,734 B2
(45) Date of Patent: Dec. 2, 2014

(54) SEMICONDUCTOR DEVICE AND METHOD OF FORMING COLUMN INTERCONNECT STRUCTURE TO REDUCE WAFER STRESS

(75) Inventors: SungWon Cho, Kyoung-gi-Do (KR); TaeWoo Kang, Kyoung-gi-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/438,402

(22) Filed: Apr. 3, 2012

(65) Prior Publication Data

US 2012/0187559 A1 Jul. 26, 2012

Related U.S. Application Data

(62) Division of application No. 12/610,763, filed on Nov. 2, 2009, now Pat. No. 8,173,536.

(51) Int. Cl.
*H01L 23/52* (2006.01)
*H01L 23/00* (2006.01)

(52) U.S. Cl.
CPC ....... *H01L 24/11* (2013.01); *H01L 2924/01019* (2013.01); *H01L 2924/01322* (2013.01); *H01L 2224/16* (2013.01); *H01L 2924/01029* (2013.01); *H01L 2924/1433* (2013.01); *H01L 2924/01013* (2013.01); *H01L 2924/01079* (2013.01); *H01L 2924/14* (2013.01); *H01L 2924/01047* (2013.01); *H01L 2924/01049* (2013.01); *H01L 2924/01082* (2013.01); *H01L 2924/014* (2013.01); *H01L 2924/01078* (2013.01); *H01L 2924/19041* (2013.01); *H01L 2924/13091* (2013.01); *H01L 2224/13099* (2013.01)
USPC ........... 257/737; 257/741; 257/750; 257/762; 257/E23.021; 257/E23.141; 257/E21.589; 438/612

(58) Field of Classification Search
CPC ........................... H01L 24/11; H01L 2224/16
USPC .......... 257/737, 741, 748, 750, 762, E23.021, 257/E23.023, E23.141, E21.588, E21.589, 257/E21.59; 438/107, 455, 612
See application file for complete search history.

(56) References Cited

U.S. PATENT DOCUMENTS

| | | | |
|---|---|---|---|
| 4,742,023 A * | 5/1988 | Hasegawa | ........ 438/614 |
| 6,043,429 A | 3/2000 | Blish, II et al. | |
| 6,577,001 B2 | 6/2003 | Kobayashi | |
| 6,995,474 B1 | 2/2006 | Ho et al. | |
| 7,112,522 B1 * | 9/2006 | Tsao et al. | ........ 438/612 |
| 7,646,100 B2 | 1/2010 | Kameyama et al. | |
| 7,666,788 B2 | 2/2010 | Sinha | |

(Continued)

*Primary Examiner* — Colleen A Matthews
*Assistant Examiner* — Colleen E Snow
(74) *Attorney, Agent, or Firm* — Robert D. Atkins; Patent Law Group: Atkins and Associates, P.C.

(57) ABSTRACT

An interconnect pad is formed over a first substrate. A photoresist layer is formed over the first substrate and interconnect pad. A portion of the photoresist layer is removed to form a channel and expose a perimeter of the interconnect pad while leaving the photoresist layer covering a central area of the interconnect pad. A first conductive material is deposited in the channel of the photoresist layer to form a column of conductive material. The remainder of the photoresist layer is removed. A masking layer is formed around the column of conductive material while exposing the interconnect pad within the column of conductive material. A second conductive material is deposited over the first conductive layer. The second conductive material extends above the column of conductive material. The masking layer is removed. The second conductive material is reflowed to form a column interconnect structure over the semiconductor device.

19 Claims, 7 Drawing Sheets

(56) References Cited

U.S. PATENT DOCUMENTS

| | | |
|---|---|---|
| 7,989,356 B2 | 8/2011 | Bao et al. |
| 2003/0013291 A1 | 1/2003 | Chen et al. |
| 2005/0017376 A1 | 1/2005 | Tsai |
| 2007/0075410 A1* | 4/2007 | Chan et al. .................... 257/678 |
| 2009/0051048 A1 | 2/2009 | Lai et al. |
| 2012/0286433 A1* | 11/2012 | Lu et al. ........................ 257/779 |

* cited by examiner

US 8,901,734 B2

SEMICONDUCTOR DEVICE AND METHOD OF FORMING COLUMN INTERCONNECT STRUCTURE TO REDUCE WAFER STRESS

CLAIM TO DOMESTIC PRIORITY

The present application is a division of U.S. patent application Ser. No. 12/610,763, now, U.S. Pat. No. 8,173,536, filed Nov. 2, 2009, which is incorporated herein by reference.

FIELD OF THE INVENTION

The present invention relates in general to semiconductor devices and, more particularly, to a semiconductor device and method of forming a column interconnect structure for lower wafer stress.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

FIG. 1 shows a conventional interconnect structure formed over a semiconductor wafer containing a base substrate material such as silicon, germanium, gallium arsenide, indium phosphide, or silicon carbide, for structural support. A plurality of semiconductor die 10 is formed on the semiconductor wafer. Each semiconductor die 10 has an active surface 12 containing analog or digital circuits implemented as active devices, passive devices, conductive layers, and dielectric layers formed within the die and electrically interconnected according to the electrical design and function of the die. Semiconductor die 10 can be a flipchip type device. A conductive pillar or column 14 is formed on metal pad 16 of active surface 12. Metal pad 16 is electrically connected to circuitry on active surface 12. A printed circuit board (PCB) or substrate 18 also contains a metal pad 20. Conductive pillar 14 is metallurgically and electrically connected to metal pad 20 with bump or solder cap 22. The height of conductive pillar 14 imposes mechanical and thermal stress on the interconnect structure between semiconductor die 10 and substrate 18. The stress can cause delamination of interlayer dielectric (ILD) in semiconductor die 10 and potential device failure.

SUMMARY OF THE INVENTION

A need exists to reduce failures of interconnect structures on semiconductor devices. Accordingly, in one embodiment, the present invention is a semiconductor device comprising a first substrate and first conductive layer formed over the first substrate. A column of first conductive material is formed over the first conductive layer. A second conductive material is disposed over the first conductive layer within a central region of the column of first conductive material to form a column interconnect structure. The second conductive material has a rounded shape extending above the column of first conductive material.

In another embodiment, the present invention is a semiconductor device comprising a first substrate and first conductive layer formed over the first substrate. A column of first conductive material is formed over the first conductive layer. A second conductive material is disposed over the first conductive layer within an interior region of the column of first conductive material as a column interconnect structure. The second conductive material extends above the column of first conductive material.

In another embodiment, the present invention is a semiconductor device comprising a first substrate and first conductive layer formed over the first substrate. A column of first conductive material is formed over the first conductive layer. A second conductive material is disposed within an interior region of the column of first conductive material as a column interconnect structure.

In another embodiment, the present invention is a semiconductor device comprising a first substrate and column of first conductive material formed over the first substrate. A second conductive material is disposed within an interior region of the column of first conductive material as a column interconnect structure.

DETAILED DESCRIPTION OF THE DRAWINGS

Figure 1:
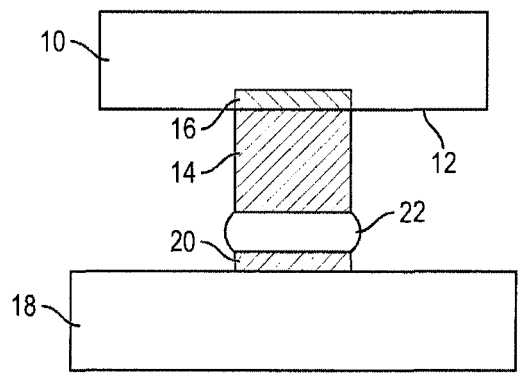
FIG. 1 illustrates a conventional interconnect structure formed over a semiconductor die.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
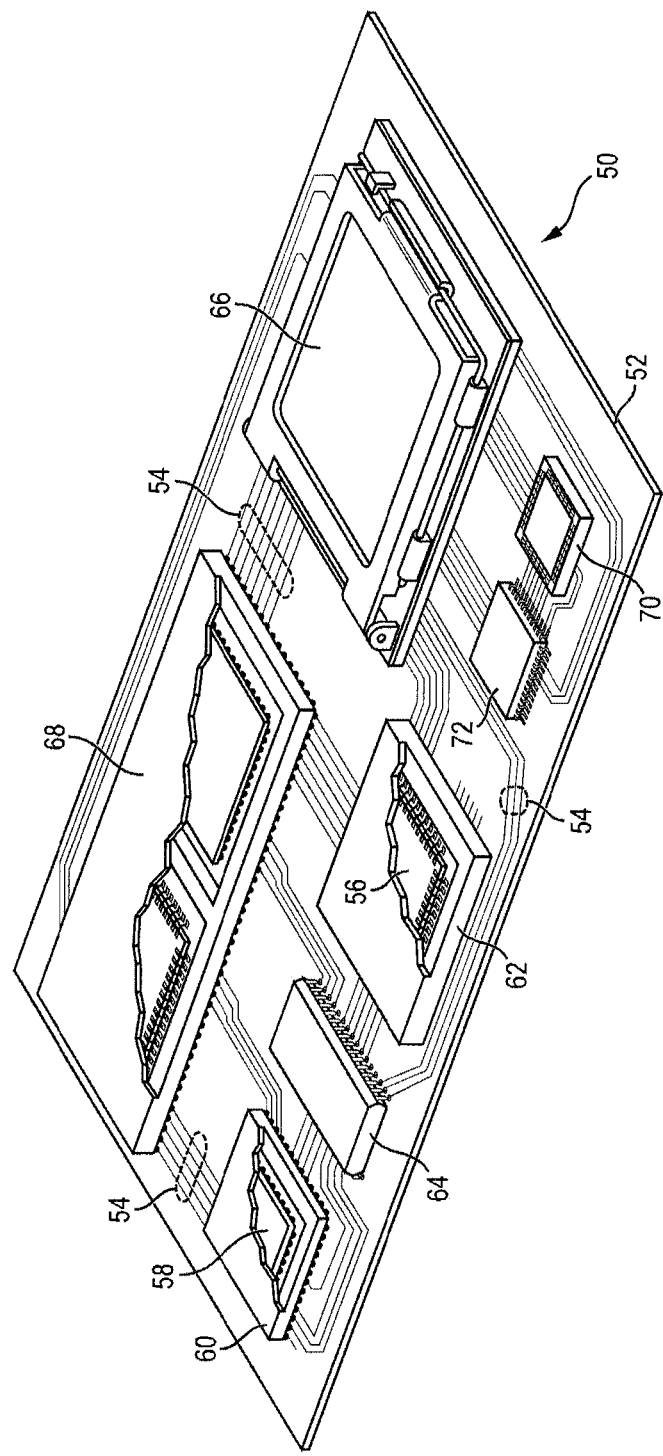
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in lower cost for consumers.

Figure 3A:
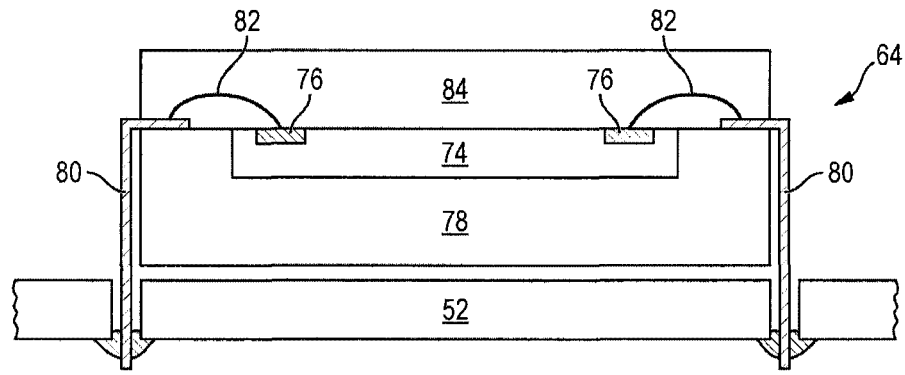
FIGS. 3a-3c illustrate further detail of the representative semiconductor packages mounted to the PCB.
Figure 3B:
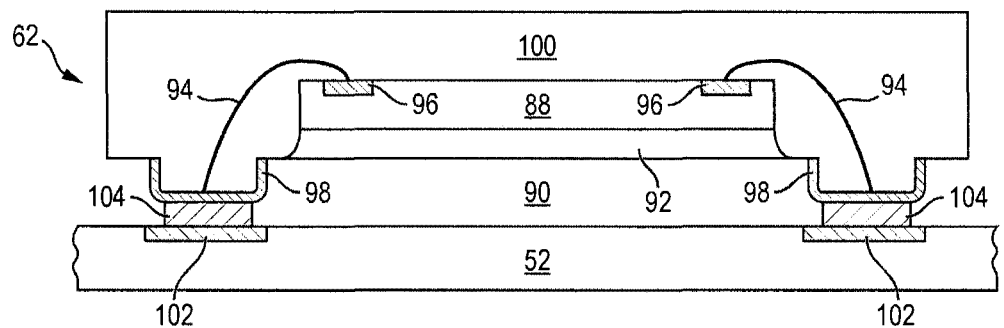
Figure 3C:
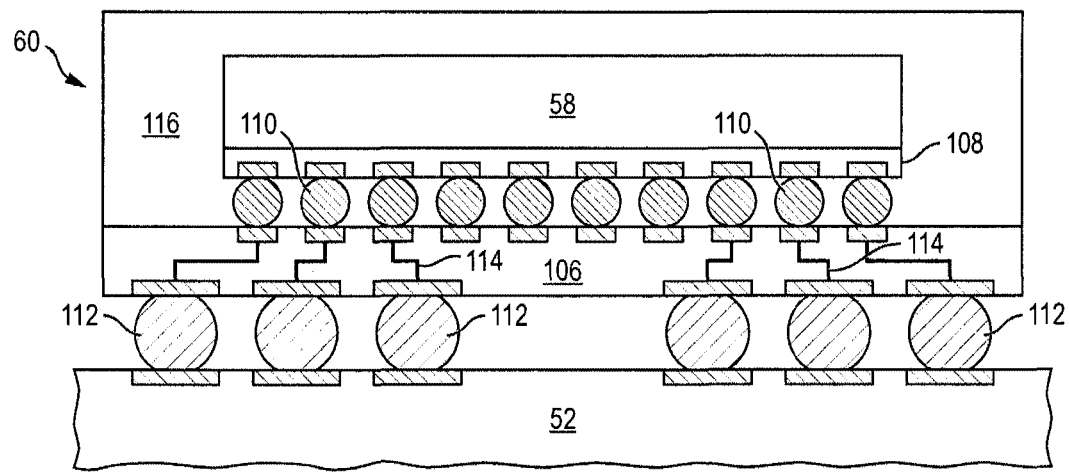

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4A:
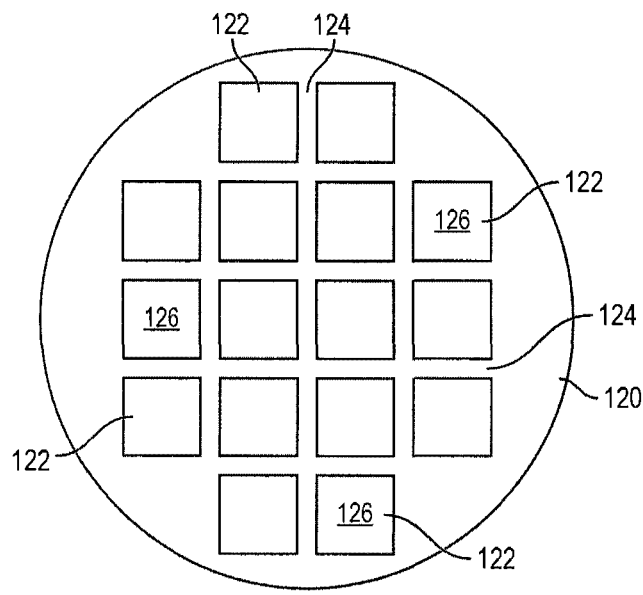
FIGS. 4a-4m illustrate a process of forming a column interconnect structure for lower wafer stress.

FIGS. 4a-4m illustrate, in relation to FIGS. 2 and 3a-3c, a process of forming a column interconnect structure to reduce wafer stress. FIG. 4a shows a semiconductor wafer 120 containing a base substrate material such as silicon, germanium, gallium arsenide, indium phosphide, or silicon carbide, for structural support. A plurality of semiconductor die 122 is formed on semiconductor wafer 120 separated by saw streets 124 using the processes described above. Each semiconductor die or component 122 has an active surface 126 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 126 to implement analog circuits or digital circuits, such as digital signal processor (DSP), ASIC, memory, or other signal processing circuit. Semiconductor die 122 may also contain integrated passive devices (IPDs), such as inductors, capacitors, and resistors, for RF signal processing. In one embodiment, semiconductor die 122 is implemented as a flipchip type device.

Figure 4B:
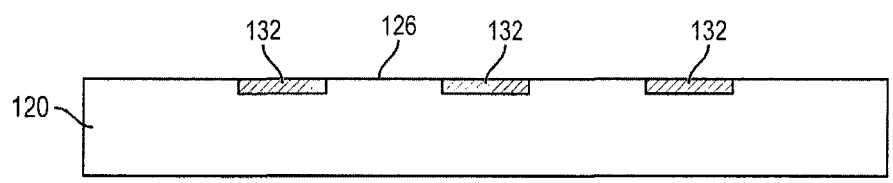

In FIG. 4b, an electrically conductive layer 132 is formed over active surface 126 of semiconductor wafer 120 using a patterning and deposition process such as PVD, CVD, sputtering, electrolytic plating, and electroless plating. Conductive layer 132 can be one or more layers of Al, Cu, Sn, Ni, Au, Ag, or other suitable electrically conductive material. Conductive layer 132 are interconnect pads, which are electrically connected to circuitry on active surface 126. In one embodiment, interconnect pads 132 are circular, rectangular, or other suitable shape.

Figure 4C:
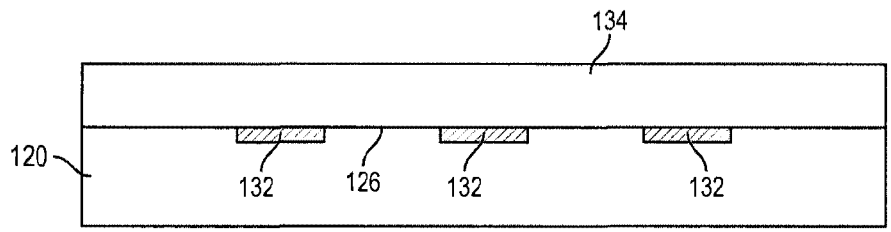
Figure 4D:
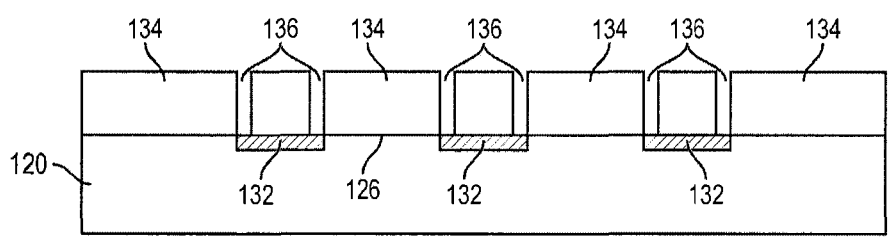
Figure 4E:
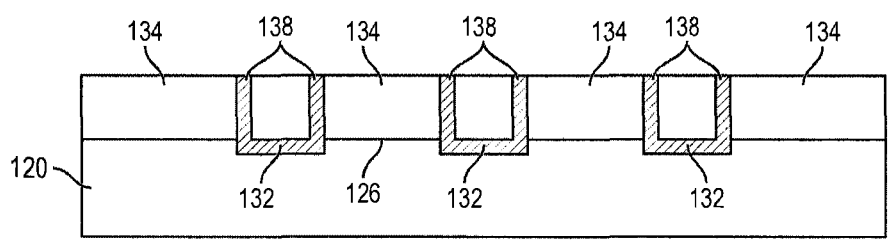
Figure 4F:
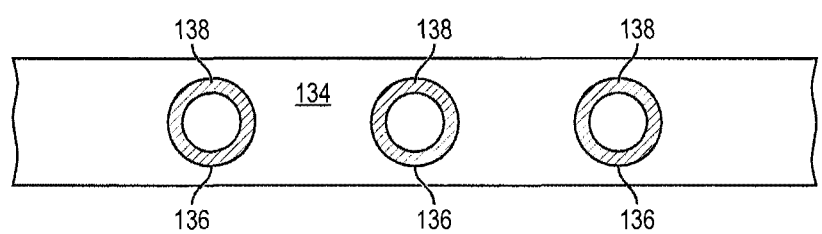
Figure 4G:
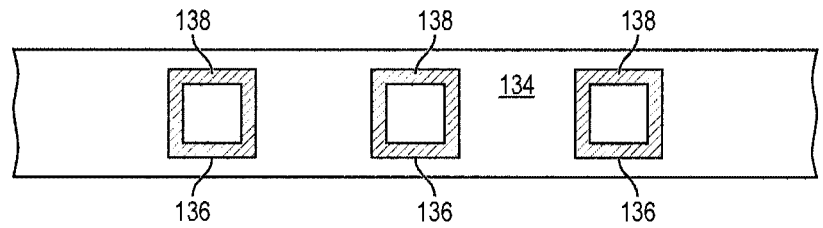

In FIG. 4c, a photoresist layer 134 is deposited over active surface 126 and interconnect pads 132. A portion of photoresist layer 134 around a perimeter portion of interconnect pads 132 is patterned by exposure and removed by an etching process to form vertical channels 136, as shown in FIG. 4d. Channels 136 can be circular or rectangular. The photoresist layer 134 over a central region of interconnect pads 132 remains in place. An electrically conductive material 138 is deposited in channels 136 using a deposition process such as electrolytic plating and electroless plating, as shown in FIG. 4e. Conductive material 138 can be one or more layers of Al, Cu, Sn, Ni, Au, Ag, or other suitable electrically conductive material. Conductive material 138 is electrically connected to the perimeter portion of interconnect pads 132. FIG. 4f shows a top view of photoresist layer 134 with conductive material 138 formed in circular channels 136. FIG. 4g shows a top view of an alternate embodiment with photoresist layer 134 and conductive material 138 formed in rectangular channels 136.

Figure 4H:
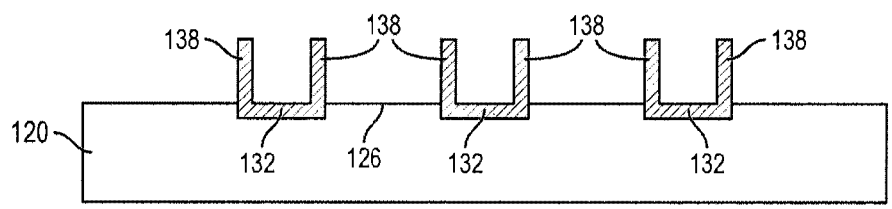
Figure 4I:
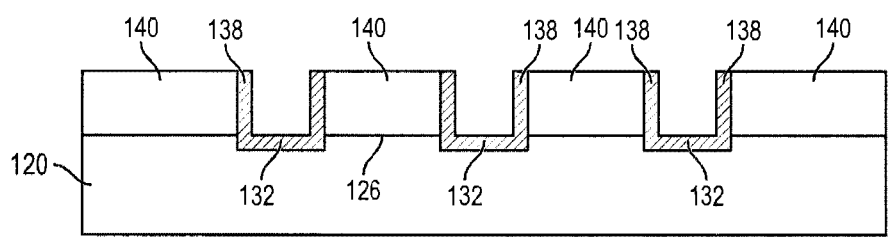

In FIG. 4h, photoresist layer 134 is removed. A masking layer 140 is deposited between conductive material 138 in FIG. 4i. No masking layer 140 is formed over interconnect pads 132, i.e., masking layer 140 leaves the area over interconnect pads 132 open.

Figure 4J:
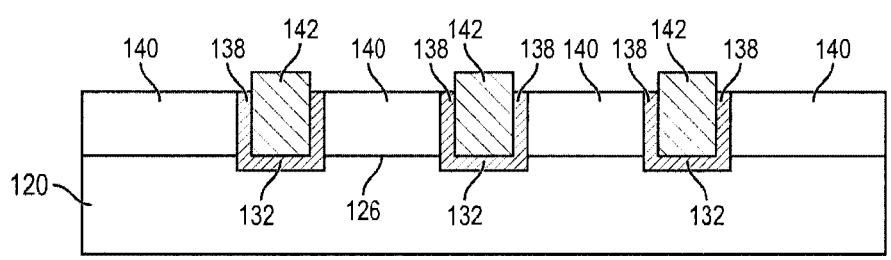
Figure 4K:
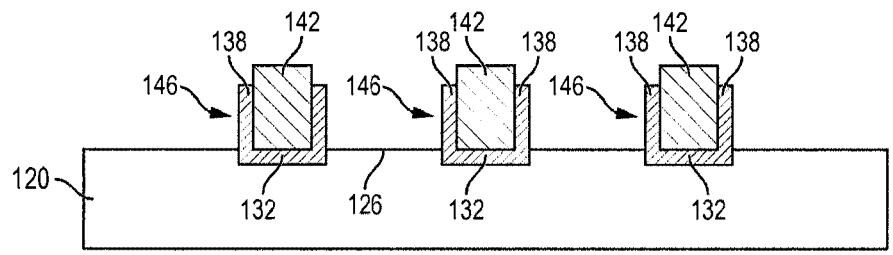

In FIG. 4j, an electrically conductive material 142 is deposited over interconnect pads 132 between conductive material 138 to form column interconnect structure 146. Conductive material 138 can be one or more layers of Al, Cu, Sn, Ni, Au, Ag, or other suitable electrically conductive material. Conductive material 142 extends above conductive material 138. In one embodiment, conductive material 142 is plated solder. Masking layer 140 is removed in FIG. 4k.

Figure 4L:
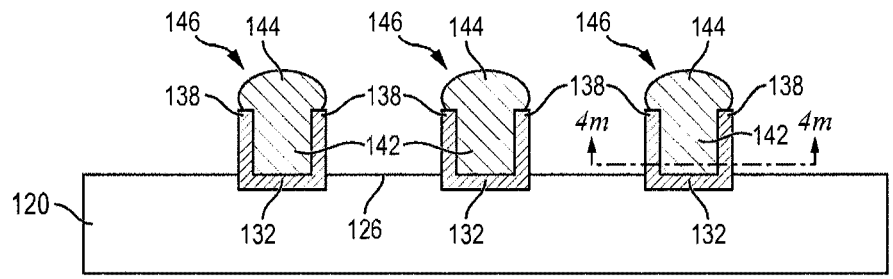
Figure 4M:
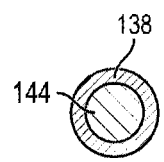

In FIG. 4l, conductive material is heated above its melting temperature to reflow the conductive material and form bumps 144. Column interconnect structure 146 includes an inner core of conductive material 142 (solder), surrounded by an outer column of conductive material 138 (Cu). FIG. 4m shows a cross-sectional view through conductive material 138 and 142 of column interconnect structure 146.

In semiconductor device 148, the circuitry on active surface 126 is electrically connected through interconnect pads 132 and column interconnect structure 146 to external devices. The inner core of conductive material 142 (solder), surrounded by an outer column of conductive material 138 (Cu), provides additional strength for column interconnect structure 146, which is particularly useful to reduce mechanical and thermal stress on low dielectric constant (K) semiconductor wafer 120. The inner core 142 relieves stress by the lower modulus of solder while the outer column 138 increases strength to resist ILD delamination and device failure. The interconnect structure 146 also provides for smaller interconnect pitch, while reducing occurrence of interconnect bridges.

Figure 5A:
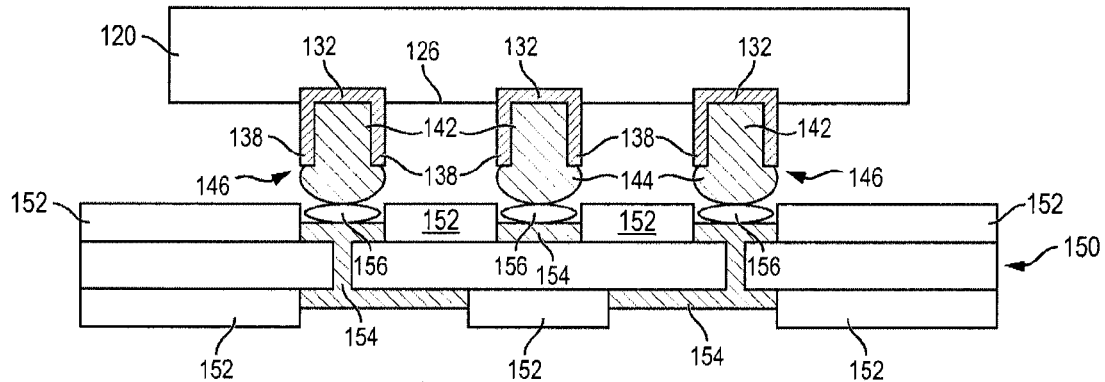
FIG. 5a-5c illustrate mounting the semiconductor die to a substrate.
Figure 5B:
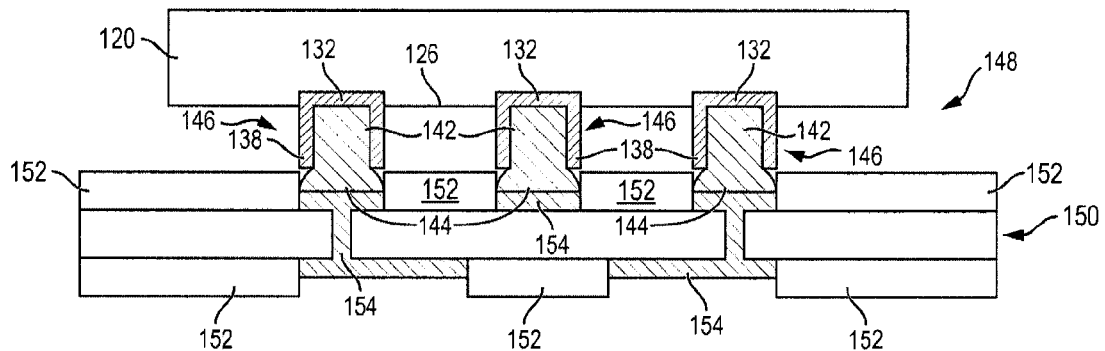

FIG. 5a shows semiconductor device 148 mounted to substrate or PCB 150. Substrate 150 includes insulating or dielectric layers 152 and interconnected conductive layers 154. Flux material 156 is deposited between bumps 144 of interconnect structure 146 and conductive layer 154. Bumps 144 are reflowed with flux material 156 to metallurgically and electrically connect interconnect structure 146 to conductive layer 154, as shown in FIG. 5b.

Figure 5C:
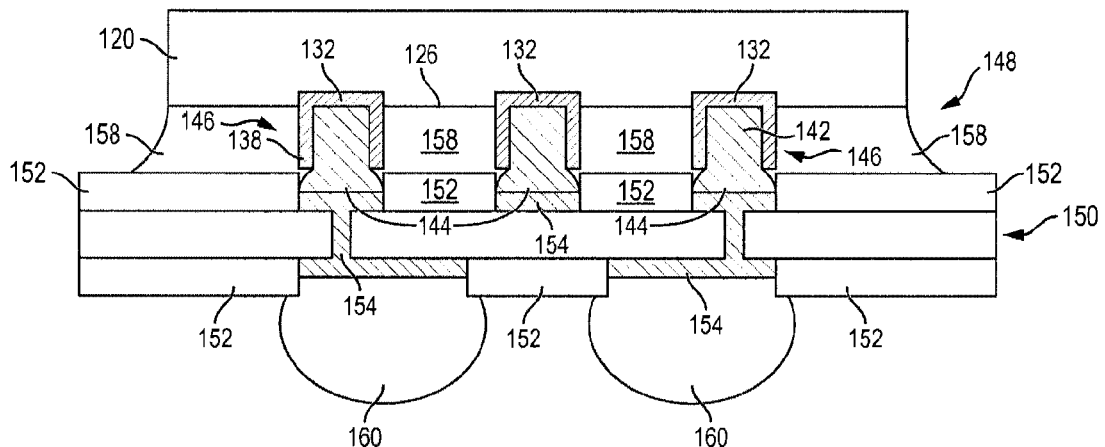

In FIG. 5c, an underfill material 158, such as epoxy, polymeric material, film, or other non-conductive material, is deposited beneath semiconductor die 122 around interconnect structure 146. An electrically conductive bump material is deposited over conductive layer 154 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 154 using a suitable attachment or bonding process. In one embodiment, the bump material is reflowed by heating the material above its melting point to form spherical balls or bumps 160. In some applications, bumps 160 are reflowed a second time to improve electrical contact to conductive layer 154. The bumps can also be compression bonded to conductive layer 154. Bumps 160 represent one type of interconnect structure that can be formed over conductive layer 154. The interconnect structure can also use stud bumps, micro bumps, conductive pillars, or other electrical interconnect.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
a first substrate;
a first conductive layer formed over the first substrate;
a column of first conductive material formed over the first conductive layer; and
a second conductive material extending from the first conductive layer and surrounded by the column of first conductive material as a column interconnect structure.
2. The semiconductor device of claim 1, wherein the column of first conductive material is circular or rectangular.
3. The semiconductor device of claim 1, wherein the column of first conductive material includes copper.
4. The semiconductor device of claim 1, wherein the second conductive material includes solder.
5. The semiconductor device of claim 1, wherein the second conductive material is formed as a bump over the column of first conductive material.
6. The semiconductor device of claim 1, further including:
a second substrate; and
a second conductive layer disposed over the second substrate, wherein the first substrate is mounted to the second substrate with the column interconnect structure electrically connected to the second conductive layer.
7. The semiconductor device of claim 1, wherein the second conductive material disposed within the column of first conductive material provides stress relief for the column interconnect structure.
8. A semiconductor device, comprising:
a first substrate;
a first conductive layer formed over the first substrate;
a first conductive material formed over the first conductive layer; and
a second conductive material extending from the first conductive layer and surrounded by the first conductive material as an interconnect structure.
9. The semiconductor device of claim 8, wherein the second conductive material extends above a column of the first conductive material.
10. The semiconductor device of claim 9, wherein the second conductive material includes a rounded shape extending above the column of first conductive material.
11. The semiconductor device of claim 9, wherein the column of first conductive material is circular or rectangular.
12. The semiconductor device of claim 9, wherein the column of first conductive material includes copper.
13. The semiconductor device of claim 8, wherein the second conductive material includes solder.
14. The semiconductor device of claim 8, further including:
a second substrate; and
a second conductive layer disposed over the second substrate, wherein the first substrate is mounted to the second substrate with the interconnect structure electrically connected to the second conductive layer.

15. A semiconductor device, comprising:
- a first substrate;
- a column of first conductive material extending from a surface of the first substrate; and
- a second conductive material extending through the column of first conductive material as a column interconnect structure.

16. The semiconductor device of claim 15, wherein the second conductive material extends above the column of first conductive material.

17. The semiconductor device of claim 15, wherein the column of first conductive material is circular or rectangular.

18. The semiconductor device of claim 15, wherein the column of first conductive material includes copper.

19. The semiconductor device of claim 15, further including:
- a second substrate; and
- a second conductive layer disposed over the second substrate, wherein the first substrate is mounted to the second substrate with the column interconnect structure electrically connected to the second conductive layer.

* * * * *